United States Patent [19]
Kamada

[11] Patent Number: 5,936,270
[45] Date of Patent: Aug. 10, 1999

[54] ACTIVE TYPE SOLID-STATE IMAGE DEVICE AND METHOD FOR FABRICATING THE SAME

[75] Inventor: Yoshinori Kamada, Kashiba, Japan

[73] Assignee: Sharp Kabushiki Kaisha, Osaka, Japan

[21] Appl. No.: 08/810,648

[22] Filed: Mar. 3, 1997

[30] Foreign Application Priority Data

Mar. 6, 1996 [JP] Japan .................................. 8-049333

[51] Int. Cl.⁶ .................................................. H01L 31/113
[52] U.S. Cl. ........................................ 257/291; 257/443
[58] Field of Search ................................ 257/290, 291, 257/443, 258

[56] References Cited

U.S. PATENT DOCUMENTS 4,929,994   5/1990   Matsumoto ............................ 257/291

OTHER PUBLICATIONS

T. Watanabe, Japanese Laid–Open Patent Publication No. 8-708653, Published on Mar. 22, 1996.
T. Watanabe, et al., Japanese Laid–Open Patent Publication No. 8-250697. Published on Sep. 27, 1996.
K. Matsumoto, et al., "The Operation Mechanism of a Charge Modulation Device (CMD) Image Sensor", IEEE Transactions On Electron Devices, vol. 38, No. 5, pp. 989–998, May 1991.
J. Hynecek, "A New Device Architecture Suitable for High–Resolution and High–Performance Image Sensors", IEEE Transactions on Electron Devices, vol. 35, No. 5, pp. 646–652, May 1988.
E.R. Fossum, "CMOS Image Sensors: Electronic Camera on a Chip", IEEE Transactions on Electron Devices, 1995, pp. 17–25.
J. Hynecek, "BCMD–An Improved Photosite Structure for High–Density Image Sensors", IEEE Transactions on Electronic Devices, vol. 38, No. 5, pp. 1011–1020, May, 1991.

*Primary Examiner*—Gene M. Munson
*Attorney, Agent, or Firm*—David G. Conlin; William J. Daley, Jr.

[57] ABSTRACT

The active type solid-state imaging device of this invention having a transistor for obtaining signal charges by photoelectric conversion of incident light, accumulating the signal charges, and outputting an electric signal corresponding to the accumulated signal charges, includes an electric field strength buffering region for lowering the electric field strength between at least one of a source region and a drain region of the transistor and a photoelectric conversion region.

4 Claims, 11 Drawing Sheets

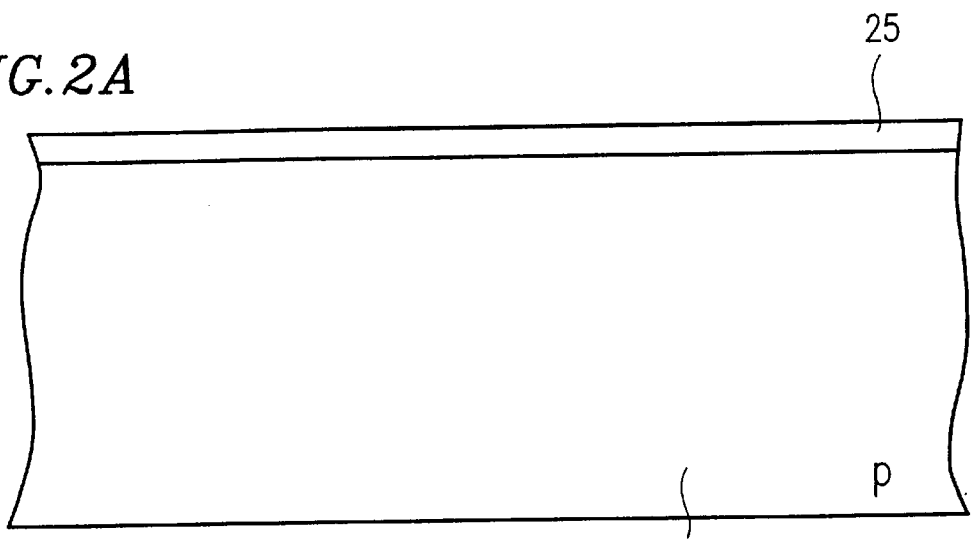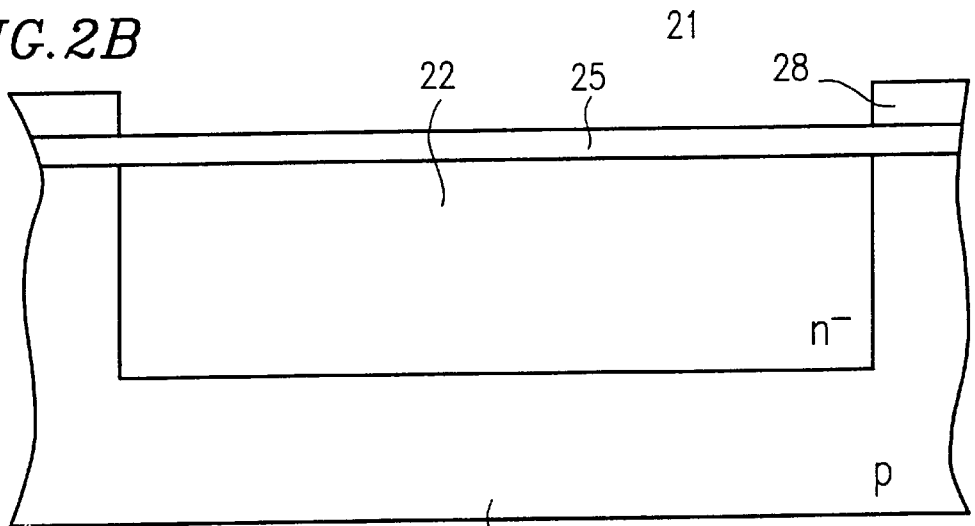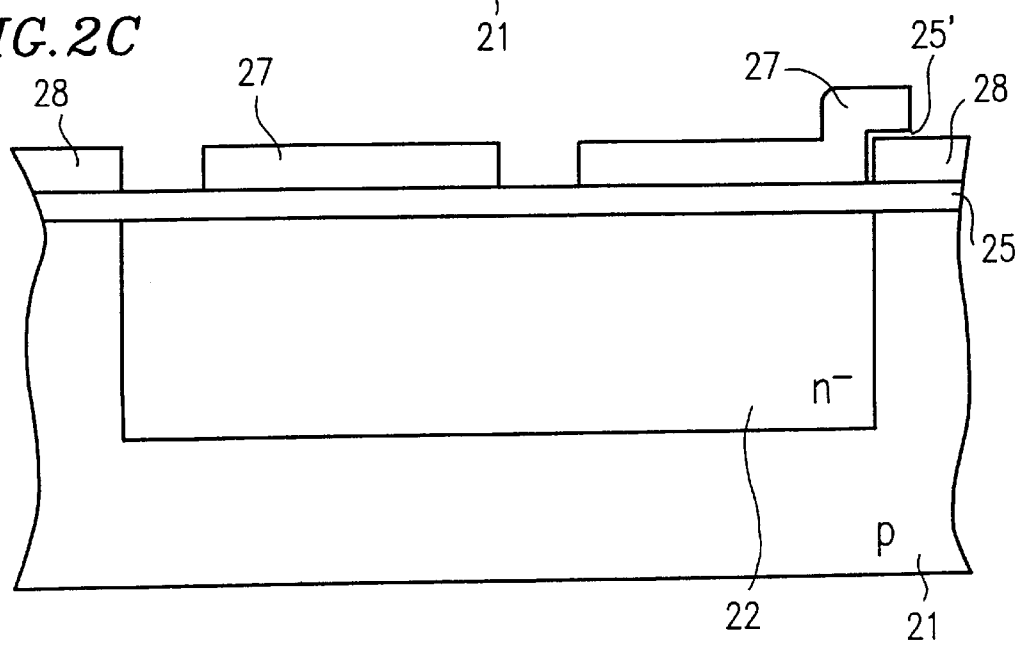

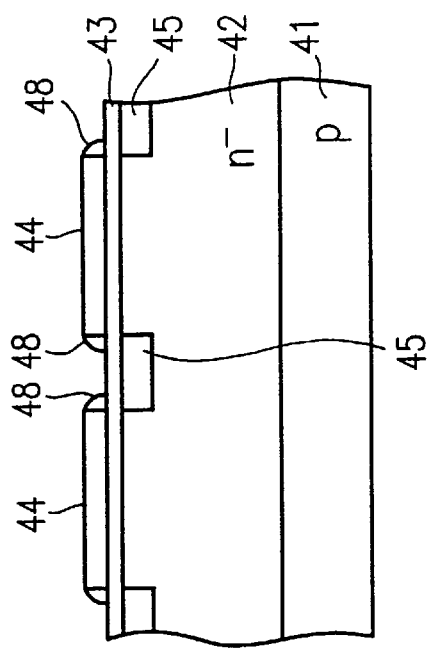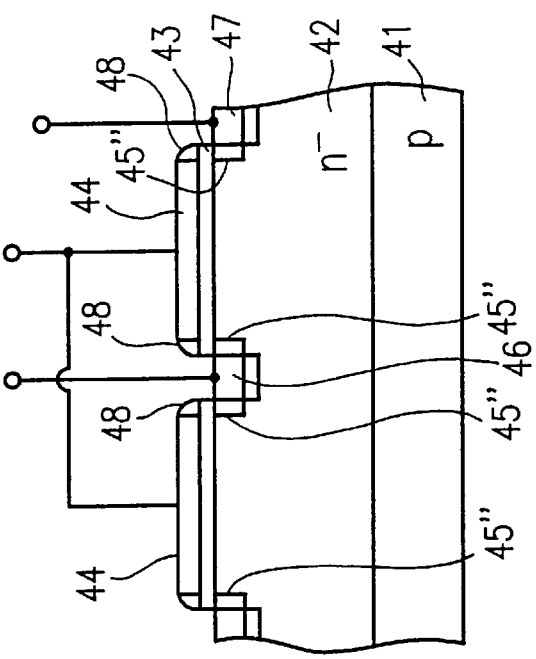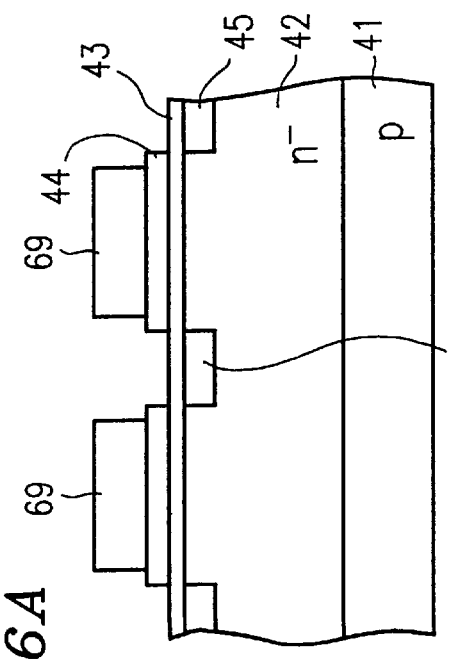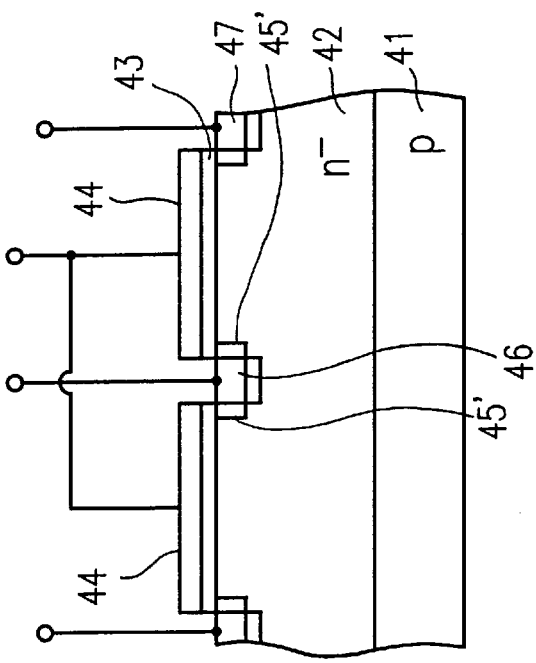

ACTIVE TYPE SOLID-STATE IMAGE DEVICE AND METHOD FOR FABRICATING THE SAME

BACKGROUND OF THE INVENTION

1. Field of the Invention

The present invention relates to an active type solid-state imaging device having a transistor, such as an MOSFET (metal-oxide-semiconductor type field effect transistor) or a junction gate FET, which accumulates signal charges generated by photoelectric conversion of incident light and outputs an electric signal corresponding to the accumulated signal charges, and a method for fabricating such an active type solid-state imaging device.

2. Description of the Related Art

A charge coupled device (CCD) type has been a mainstream of solid-state imaging apparatuses and widely utilized in various fields. In such a CCD type imaging apparatus, signal charges obtained by photoelectric conversion and accumulated using a photodiode or a MOS diode are transferred through a CCD transfer channel to a charge detection section with high sensitivity, where the signal charges are converted into a voltage signal. The CCD type imaging apparatus is therefore characterized in a high S/N ratio and high output voltage.

In the recent trend of reducing the size of the imaging apparatus and increasing the number of pixels, the size of each pixel has reduced thus decreasing the amount of charge which can be transferred by the CCD. This has caused a serious problem of lowering a dynamic range of the apparatus. Moreover, since the CCD as a whole is driven with several phases of clocks, the load capacity increases and high driving voltage is required. Therefore, as the number of pixels increases, the power consumption significantly increases.

In order to overcome the above problems, an active type imaging apparatus has been proposed, where signal charges generated in respective pixels are not directly read out, but are read out by a scanning circuit after the signal charges are amplified in the respective pixels. Such an apparatus eliminates the limit on the signal magnitude and makes the dynamic range broader than that of the CCD type. Moreover, in the active type imaging device, since only a horizontal line and a perpendicular line corresponding to a pixel to be read out can be driven with a lower voltage, the power consumption is smaller than that required for the CCD type.

A transistor is generally used for amplifying signal charges in each pixel of such an active type imaging apparatus. Transistors are classified into a SIT (static induction transistor) type, a bipolar type, a FET type (a MOS type and a junction type), and the like. Among these types of transistors, a MOSFET is advantageously used for this purpose in consideration of the configuration of the entire apparatus, because a scanning circuit for signal readout can be constructed more easily using this type of transistor. In other words, while a SIT type or a bipolar type transistor is formed in a depth direction, a MOSFET type transistor is formed in a plane direction. The latter is more advantageous in the fabrication of the apparatus. Especially, an imaging apparatus in which only a single MOSFET is included in each pixel is more advantageous to increase the pixel density. As this type of active type imaging apparatus, a type proposed in Japanese Laid-Open Patent Publication No. 8-78653 (hereinbelow, this type is referred to as a TGMIS (twin gate MOS image sensor) since two gate electrodes are used), a CMD (charge modulation device) type, and the like have been reported.

FIG. 12 is a sectional view of a pixel portion of a TGMIS active type solid-state imaging apparatus proposed in the above-mentioned Japanese Laid-Open Patent Publication No. 8-78653.

Referring to FIG. 12, a second gate electrode 3 is formed on a p-type semiconductor substrate 1 via an insulating film 2. Then, an $n^-$-type well region 4 is formed in the surface portion of the semiconductor substrate 1, and an $n^+$-type diffusion region 5 for a source and an $n^+$-type diffusion region 6 for a drain are formed in the $n^-$-type well region 4. A first gate electrode 7 is formed on the $n^-$-type well region 4 via the insulating film 2. The first gate electrode 7 as a gate, and the $n^+$-type diffusion regions 5 and 6 as a source and a drain, respectively, constitute a MOS transistor. Thus, a TGMIS active type imaging device is constructed. A plurality of such imaging devices are arranged in a matrix as pixels to complete a TGMIS active type imaging apparatus.

With the above configuration, pairs of electrons and holes are generated in the surface portion of the $n^-$-type well region 4 by photoelectric conversion of light energy hv incident through the first gate electrode 7. Electrons flow to the source and drain regions, while holes are accumulated in the $n^-$-type well layer 4 at the interface with the insulating film 2 as signal charges. In this way, the MOS transistor formed in each pixel allows signal charges to be generated by photoelectric conversion of incident light and accumulated. An electric signal corresponding to the accumulated signal charges is then output.

FIG. 13 is a sectional view of a pixel portion of a conventional CMD active type solid-state imaging apparatus. An $n^-$-type well layer 12 is formed on a p-type semiconductor substrate 11 in a buried-in fashion. A gate electrode 14 is formed on the $n^-$-type well layer 12 via an insulating film 13. A source region 15 and a drain region 16 which are high-concentration $n^+$-type regions are formed in the surface portion of the $n^-$-type well layer 12 so that they are separated by the gate electrode 14.

However, the above-mentioned conventional imaging apparatuses have the following disadvantages. In the TGMIS active type imaging apparatus shown in FIG. 12, since the source and drain regions 5 and 6 are high-concentration $n^+$-type diffusion regions, a large concentration gradient exists between the source and drain regions 5 and 6 and the low-concentration $n^-$-type well region 4. This is considered to strengthen the electric field in the surface portion of the regions and thus accelerate the movement of carriers, generating impact ions. As a result, pairs of electrons and holes are generated in the surface portion of the $n^-$-type well region 4 under the first gate electrode 7 where photoelectric conversion occurs. Electrons of these pairs flow to the source and drain regions, while dark current is generated by the remaining holes. These holes also accumulate at the interface with the insulating film 2 as additional signal charges.

In the CMD active type solid-state imaging apparatus shown in FIG. 13, also, the source and drain regions 15 and 16 are high-concentration $n^+$-type regions. Therefore, the same drawbacks associated with the TGMIS active type imaging apparatus occurs.

Thus, the conventional active type solid-state imaging apparatus includes a first-conductivity type substrate, a low-concentration second-conductivity type well region formed on the substrate as a channel, a gate electrode formed on the well region via an insulating film, and high-concentration second-conductivity type source and drain regions formed in the surface portion of the well region. The ion concentration gradient is sharp at and around the interfaces between the drain and source regions and a photoelectric conversion portion of the well region. This causes pseudo signal charges to be generated by impact ions, increasing dark current in the photoelectric conversion portion.

Therefore, there is a strong need in the art for an imaging device which reduces dark current in a photoelectric conversion portion by minimizing the generation of impact ions.

SUMMARY OF THE INVENTION

The active type solid-state imaging device of this invention having a transistor for obtaining signal charges by photoelectric conversion of incident light, accumulating the signal charges, and outputting an electric signal corresponding to the accumulated signal charges, includes an electric field strength buffering region for lowering the electric field strength between at least one of a source region and a drain region of the transistor and a photoelectric conversion region.

In one embodiment of the invention, the transistor includes a first gate region formed in a surface portion of a semiconductor base for accumulating the signal charges obtained by the photoelectric conversion; and a second gate region is formed in a surface portion of the semiconductor base adjacent to the first gate region, the signal charges being discharged to the semiconductor base via the second gate region.

In another embodiment of the invention, the transistor includes a first gate region formed in a surface portion of a semiconductor base for accumulating the signal charges obtained by the photoelectric conversion, the drain region is composed of the semiconductor base, a second gate region is formed in the surface portion of the semiconductor base adjacent to the first gate region, a second drain is formed in the surface portion of the semiconductor base adjacent to the second gate region for discharging the signal charges via the second gate region, and the electric field strength buffering region is formed in the vicinity of the source region of the transistor.

In still another embodiment of the invention, the transistor includes a first gate region formed in a surface portion of a semiconductor base for accumulating the signal charges obtained by photoelectric conversion, a second gate region is formed in the surface portion of the semiconductor base adjacent to the first gate region, and a second drain is formed within the second gate region in the surface portion of the semiconductor base for discharging the signal charges via the second gate region.

In still another embodiment of the invention, an electric field blocking portion is formed in the surface portion of the semiconductor base located on a side of the second gate region opposite to a side thereof adjacent to the first gate region.

In still another embodiment of the invention, the depth of the electric field strength buffering region from the surface of the semiconductor base is equal to or more than the position of a maximum point of a potential in the photoelectric conversion region.

According to another aspect of the invention, a method for fabricating an active type solid-state imaging device having a transistor for obtaining signal charges by photoelectric conversion of incident light, accumulating the signal charges, and outputting an electric signal corresponding to the accumulated signal charges is provided. The method includes the steps of: implanting ions of a plurality of impurity elements having different diffusion coefficients in at least one of regions which are to be a source region and a drain region of the transistor; and forming by heat treatment an electric field strength buffering region for lowering the electric field strength between a high-concentration impurity region formed in the at least one of the source region and the drain region and a photoelectric conversion region.

Alternatively, the method for fabricating an active type solid-state imaging device having a transistor for obtaining signal charges by photoelectric conversion of incident light, accumulating the signal charges, and outputting an electric signal corresponding to the accumulated signal charges of this invention includes the steps of: implanting ions of a predetermined element at a low concentration in at least one of regions which are to be a source region and a drain region of the transistor; forming an insulating film with a predetermined thickness on a side wall of a control electrode on the at least one of the regions which are to be the source region and the drain region of the transistor; and forming the source region and the drain region by implanting ions of a predetermined element via an opening surrounded by the insulating film formed on the side wall of the control electrode at a high-concentration, thereby forming an electric field strength buffering region for lowering the electric field strength between the at least one of the source region and the drain region of the transistor and a photoelectric conversion region.

In one embodiment of the invention, a control region is formed so as to surround one of the source region and the drain region of the transistor, and the other region is formed to surround the control region.

Thus, the invention described herein makes possible the advantages of (1) providing an active type solid-state imaging device capable of reducing dark current in a photoelectric conversion portion by minimizing the generation of impact ions, and (2) providing a method for fabricating such an imaging device.

These and other advantages of the present invention will become apparent to those skilled in the art upon reading and understanding the following detailed description with reference to the accompanying figures.

BRIEF DESCRIPTION OF THE DRAWINGS

FIGS. 2A to 2C are sectional views illustrating steps of fabricating the active type solid-state imaging device shown in FIG. 1 according to the present invention.

FIGS. 6A to 6D are sectional views illustrating the steps of two methods for fabricating a CMD active type solid-state imaging device of Example 3 according to the present invention.

DESCRIPTION OF THE PREFERRED EMBODIMENTS

Hereinbelow, the function of the active type solid-state imaging device according to the present invention will be described.

According to the present invention, an electric field strength buffering region is formed between at least one of source and drain regions of a transistor and a photoelectric conversion portion. With this configuration, the ion concentration gradient at and around the interface between the channel portion and the at least one of the source and drain regions is made gentler, lowering the strength of the electric field generated in the surface portion of the at least one of the source and drain regions. This reduces the generation of pairs of electrons and holes caused by impact ions flowing from the at least one of the source and drain regions to the photoelectric conversion portion, and as a result the accumulation of pseudo signal charges can be minimized.

A side-wall insulating film is formed on a side wall of a control electrode after low-concentration ion injection. High-concentration ion injection is then conducted via an opening surrounded by the side-wall insulating film. Accordingly, by precisely setting the thickness of the side-wall insulating film, a precise width of the electric field strength buffering region can be obtained in a self-alignment fashion.

The present invention will now be described by way of examples with reference to the accompanying drawings.

EXAMPLE 1

Figure 1:
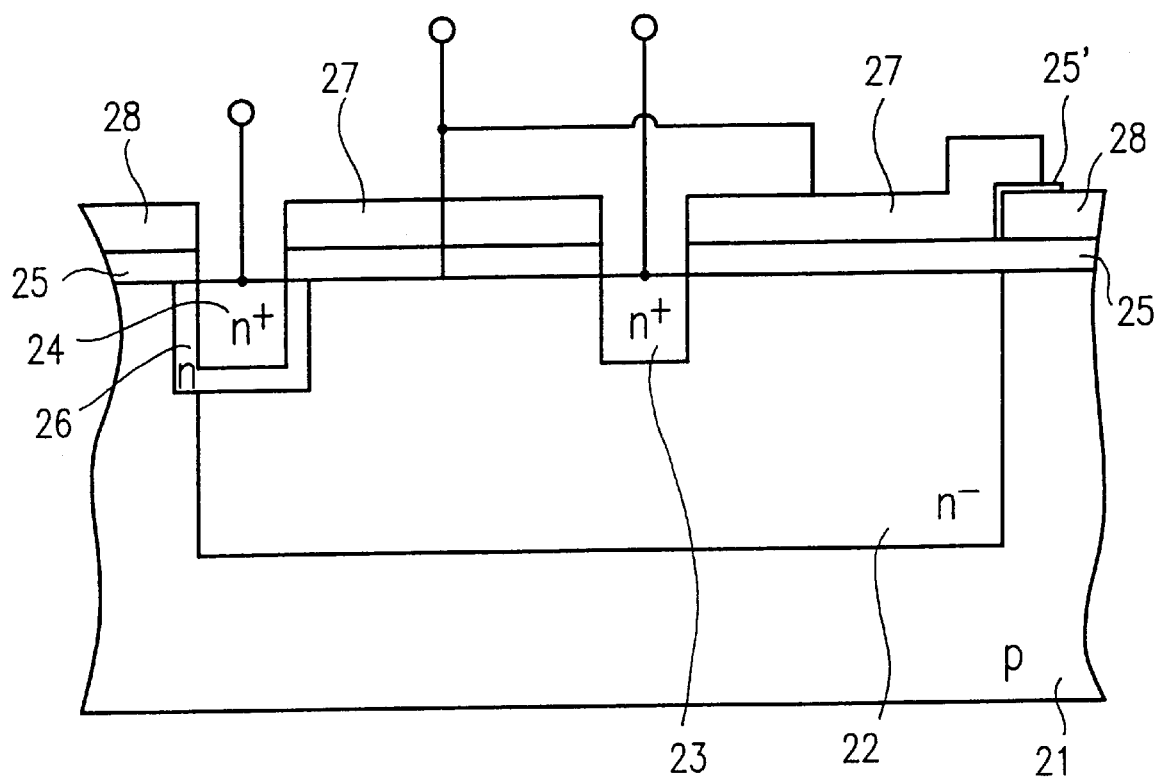
FIG. 1 is a sectional view of a pixel portion of an active type solid-state imaging device of Example 1 according to the present invention.

FIG. 1 is a sectional view of a pixel portion of an active type solid-state imaging device of Example 1 according to the present invention.

Referring to FIG. 1, a low-concentration $n^-$-type well region (substrate base) 22 to be used as a photoelectric conversion region is formed in the surface portion of a p-type semiconductor substrate 21. Source and drain regions 23 and 24 to be used as high-concentration $n^+$-type diffusion regions are formed in the surface portion of the $n^-$-type well region 22. An electric field strength buffering region 26 is formed between the drain region 24 and the $n^-$-type well region 22 to lower the electric field strength and thus reduce the generation of dark current. A first gate electrode 27 connected to a gate terminal for signal readout is formed on the $n^-$-type well region 22 and the electric field strength buffering region 26 via an insulating film 25. A second gate electrode 28 connected to a gate terminal for reset is formed on the p-type semiconductor substrate 21 via the insulating film 25.

A region under the first gate electrode 27 where photoelectric conversion occurs is called a first gate. The first gate, the source region 23, and the drain region 24 constitute a MOS transistor. A second gate is formed adjacent to the first gate. The first gate is of a buried channel structure, while the second gate is of a surface channel structure. Signal charges are accumulated in the first gate at the interface with the insulating film 25, and an electric signal corresponding to the accumulated signal charges is output. The accumulated signal charges are discharged to the p-type semiconductor substrate 21 via the second gate to effect reset.

Thus, the TGMIS active type imaging device is constructed, where photoelectric conversion occurs in the first gate of the MOS transistor formed on the p-type semiconductor substrate 21 and a potential change in the MOS transistor caused by signal charges accumulated in the first gate is used as a sensor output. A plurality of such imaging devices are arranged in a matrix as pixels to complete a TGMIS active type solid-state imaging apparatus.

The TGMIS active type solid-state imaging device with the above configuration is fabricated in the following manner.

FIGS. 2A to 2C, 3A, and 3B illustrate the steps of fabricating the active type solid-state imaging device of FIG. 1.

As shown in FIG. 2A, the insulating film 25 made of silicon oxide ($SiO_2$), silicon nitride (SiN), and the like is formed on the p-type semiconductor substrate 21.

As shown in FIG. 2B, a conductive polysilicon film is formed on the insulating film 25 by LP-CVD, for example, and patterned into a predetermined shape by lithography and etching to form the second gate electrode 28. Using the pattern of the second gate electrode 28 as a mask, impurities are implanted in the surface portion of the p-type semiconductor substrate 21 through an opening of the pattern by self ion implantation under the condition of an energy of 1000 KeV, for example, to form the $n^-$-type well region 22 with a depth of 1.5 $\mu$m and an impurity ion concentration of about $1 \times 10^{15}$ $cm^{-3}$.

As shown in FIG. 2C, an insulating film 25' is formed on the second gate electrode 28 by oxidation, and a light-transparent material such as a polysilicon thin film is formed on the insulating film and patterned into a predetermined shape by lithography and etching to form the first gate electrode 27. The predetermined pattern has openings corresponding to regions which are to be the source and drain regions of each MOS transistor.

Figure 3A:
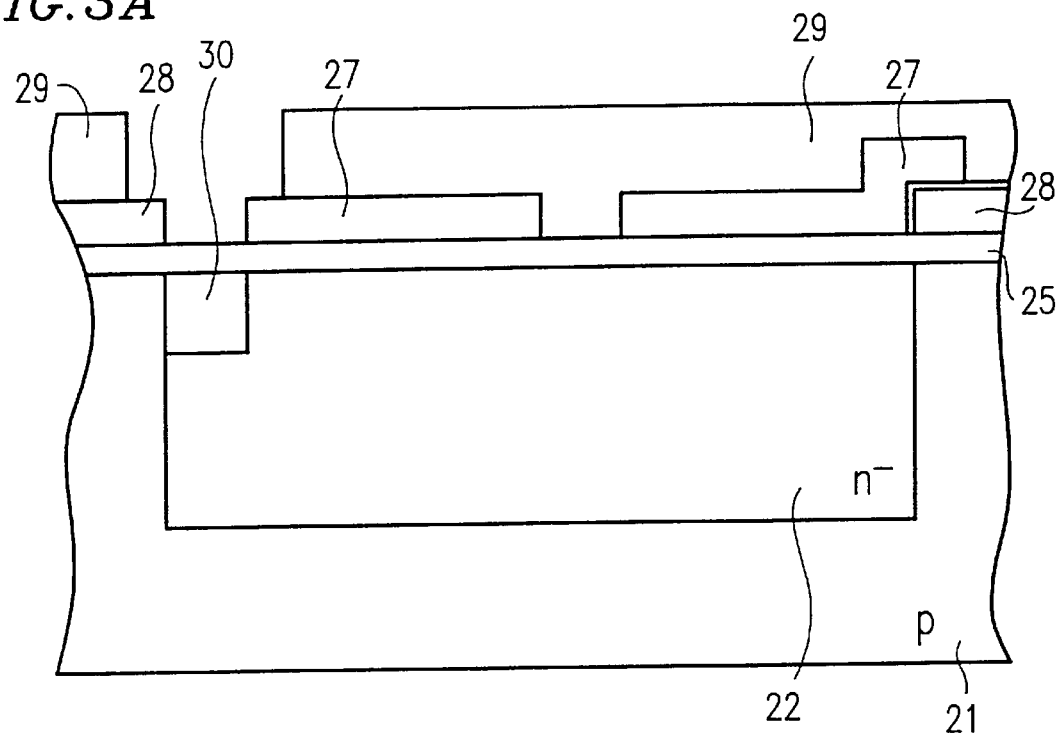
FIGS. 3A and 3B are sectional views illustrating subsequent steps of fabricating the active type solid-state imaging device shown in FIG. 1 according to the present invention.

As shown in FIG. 3A, a resist pattern 29 is formed on the resultant structure and patterned by lithography so that an opening corresponding to a region which is to be the drain region 24 of each MOS transistor is formed. Phosphorus ions, for example, are then implanted in the surface portion of the $n^-$-type well region 22 via the opening of the resist pattern 29, to form a region 30 with an ion concentration of about $1 \times 10^{17}$ $cm^{-3}$, for example.

Figure 3B:
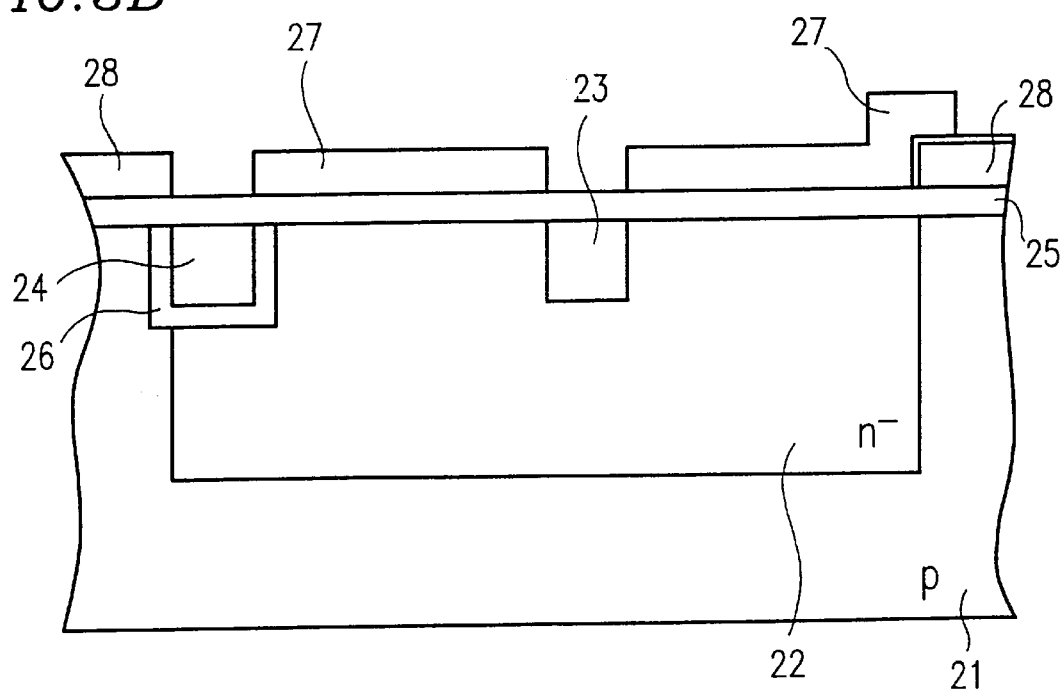

Thereafter, as shown in FIG. 3B, arsenic ions, for example, are implanted in the surface portion of the $n^-$-type well region 22 using the pattern of the first gate electrode 27 as a mask, to form the source region 23 and the drain region 24 of each MOS transistor as the high-concentration $n^+$-type diffusion regions with a concentration of about $1\times10^{20}$ cm$^{-3}$, for example. Then, a diffusion process by heating is conducted to activate the diffusion of the ions. Since the diffusion coefficient is different between phosphorus and arsenic, the n-type electric field strength buffering region 26 for lowering the electric field strength is formed between the drain region 24 as the high-concentration n$^+$-type diffusion region and the n$^-$-type well region 22.

In the case where the diffusion process is conducted at 1100° C. which is a normal temperature used for this process, the diffusion coefficients of phosphorus and arsenic in Si are $\approx 2\times10^{-13}$ cm$^{-2}$/s and $\approx 1.5\times10^{-14}$ cm$^{-2}$/s, respectively, indicating that phosphorus diffuses about 10 times faster than arsenic.

Subsequently, a film for wiring is formed by Al-Si sputtering, for example, and patterned by lithography and etching to form wirings as shown in FIG. 1, thereby to complete the MOS active type solid-state imaging device.

Thus, the electric field strength buffering region 26 is formed by implanting ions of an impurity element for the source and drain regions and ions of an impurity element for the electric field strength buffering region 26 and diffusing these ions by heating. The electric field strength buffering region 26 makes the concentration gradient in the channel region gentler and thus lowers the electric field strength in the surface portion of the drain region 24. This reduces the generation of pairs of electrons and holes caused by impact ions flowing from the drain region 24 to the low-concentration conductive region where photoelectric conversion occurs, and as a result, the accumulation of pseudo signal charges can be minimized.

EXAMPLE 2

In this example, an electric field strength buffering region 26 is formed in a manner different from that described in Example 1 where the difference of the diffusion coefficient is utilized. In this example, the size of the electric field strength buffering region 26 can be obtained with higher precision.

Figure 4A:
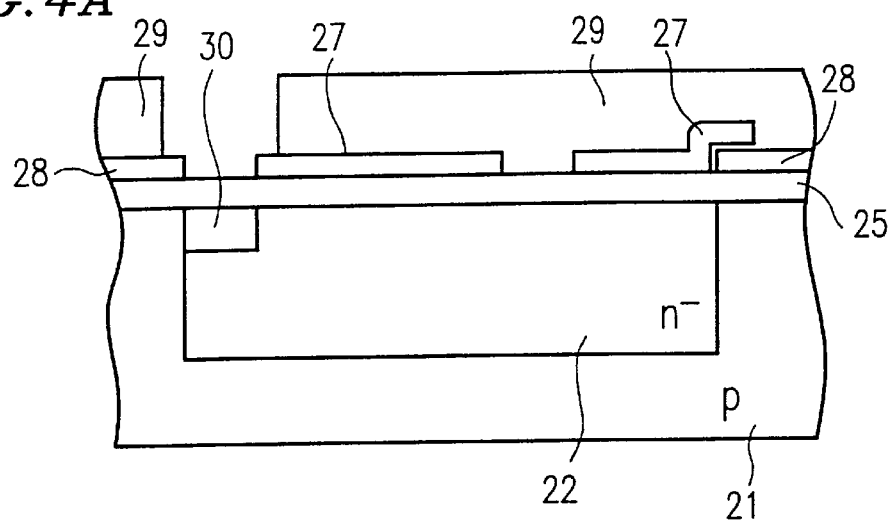
FIGS. 4A to 4C are sectional views illustrating the steps of fabricating an active type solid-state imaging device of Example 2 according to the present invention.
Figure 4B:
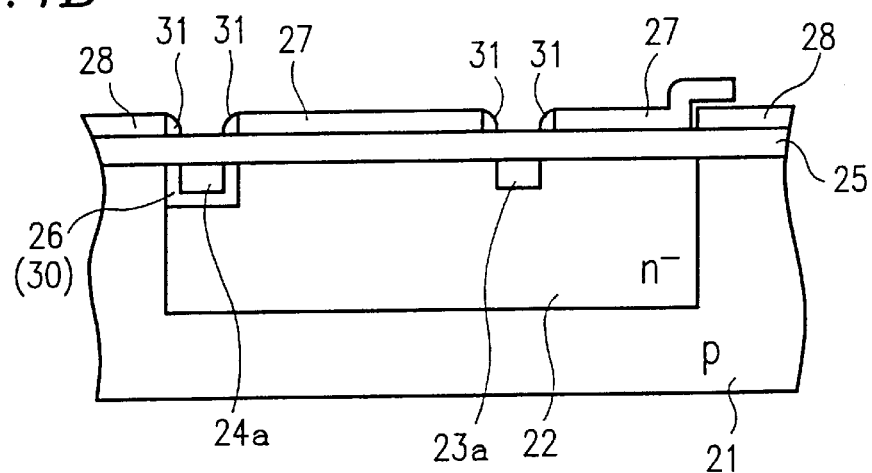
Figure 4C:
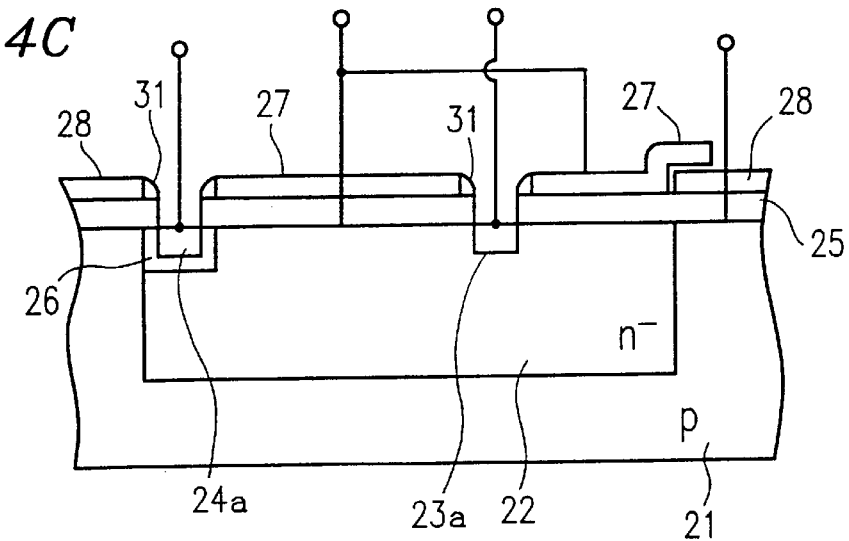

FIGS. 4A to 4C are sectional views of a pixel portion of an active type solid-state imaging device of Example 2 according to the present invention, illustrating the steps of fabricating the same.

As shown in FIG. 4A, a first gate electrode 27 is formed on an n$^-$-type well region (semiconductor base) 22 where photoelectric conversion occurs. A resist pattern 29 is formed on the resultant structure and patterned by lithography so that a portion corresponding to an n-type region which is to be the electric field strength buffering region 26 is formed in correspondence with the pattern of the first gate electrode 27. Phosphorus ions, for example, are then implanted in the surface portion of the n$^-$-type well region 22 via the opening of the resist pattern 29, to form a region 30 with an intermediate ion concentration of about $1\times10^{17}$ cm$^{-3}$, for example.

As shown in FIG. 4B, an insulating film is formed by CVD to a thickness of about 3000 Å, and etched back so that the insulating film is left unetched only on the side walls of the first gate electrodes 27 and a second gate electrode 28, to form side-wall insulating films 31. Arsenic ions, for example, are then implanted in the surface portion of the n$^-$-type well region 22 via openings surrounded by the side-wall insulating films 31, to form a source region 23a and a drain region 24a of a MOS transistor.

Subsequently, as shown in FIG. 4C, wirings are provided for the first gate electrode 27, the second gate electrode 28, the source region 23a, and the drain region 24a of each pixel portion, to complete the active type solid-state imaging device of this example.

If the n-type region 30 with an intermediate concentration of $1\times10^{17}$ cm$^{-3}$ is not formed as the field effect strength buffering region 26 between the n$^-$-type well region 22 and the n$^+$-type diffusion drain region 24a, a larger number of pairs of electrons and holes are generated due to impact ions. Electrons of these pairs flow to the drain region 24a, while holes are accumulated in the n$^-$-type well region 22 at the interface with the insulating film in addition to the signal charges duly generated by photoelectric conversion of light energy hv incident through the first gate electrode 27. In this example, however, the intermediate-concentration region 30 is formed by ion implantation using the gate electrodes 27 and 28 as a mask, and after the side-wall insulating films 31 with a predetermined size are formed on the side walls of the gate electrodes 27 and 28, the source and drain regions 23a and 24a of a transistor are formed by ion implantation. As a result, the field effect strength buffering region 26 with an intermediate ion concentration of about $1\times10^{17}$ cm$^{-3}$ is formed between the n$^-$-type well region 22 and the n$^+$-type diffusion drain region 24a. With this structure, the concentration gradient in the channel of the transistor becomes gentler, lowering the electric field strength and thus reducing the accumulation of pseudo signal charges.

The effect of the side-wall insulating films will be described. By forming the side-wall insulating films after the ion implantation for the formation of the n-type region, the higher-concentration n$^+$-type region is formed by ion implantation through an opening surrounded by the side-wall insulating film with good controllability of a size α (see FIG. 5). That is, the size α can be determined by the thickness of the side wall insulating film in a self-alignment manner.

EXAMPLE 3

In the above examples, the TGMIS active type imaging devices were described. In this example, a CMD active type imaging device will be described.

FIGS. 6A to 6D are sectional views of a pixel portion of a CMD active type imaging device of Example 3, illustrating the steps of two methods for fabricating the same. Hereinbelow, a MOS image sensor as the CMD active type imaging device of this example will be described.

One of the methods where an electric field strength buffering region is formed using the difference of the diffusion coefficient will be described with reference to FIGS. 6A and 6B.

As shown in FIG. 6A, after an n$^-$-type well layer (semiconductor base) 42 as the n$^-$-type region is formed on a p-type semiconductor substrate 41, a gate electrode 44 is formed on the n$^-$-type well layer 42 via an insulating film 43 by patterning. Using the pattern of the gate electrode 44 as a mask, a predetermined element (e.g., phosphorus) is implanted as impurity ions to form n-type regions 45 with an intermediate ion concentration in the surface portion of the n$^-$-type well layer 42. One of the n-type regions 45 is surrounded by the gate electrode 44 under which photoelectric conversion occurs, and the other n-type region 45 surrounds the gate electrode 44.

As shown in FIG. 6B, using the pattern of the gate electrode 44 as a mask, a predetermined element (e.g., arsenic) is implanted as impurity ions to form source and drain regions 46 and 47. Then, using the difference of the diffusion coefficient between arsenic and phosphorus (arsenic: $1.5 \times 10^{-14}$ cm$^2$/s, phosphorus: $2.0 \times 10^{-13}$ cm$^2$/s, at 1100° C. in Si), electric field strength buffering regions 45' are formed between the source and drain regions 46 and 47 and the n⁻-type well layer 42. The electric field strength buffering regions 45' are n-type regions with an intermediate ion concentration between the concentration of the source and drain regions 46 and 47 and that of the n⁻-type well layer 42. The ion concentration of the n⁺-type source and drain regions 46 and 47 is set at $1 \times 10^{20}$ cm$^{-3}$, while that of the electric field strength buffering regions 45' is set at $1 \times 10^{17}$ cm$^{-3}$.

As described above, the electric field strength buffering regions 45' and the source and drain regions 46 and 47 can be formed in a self-alignment fashion using the pattern of the gate electrode 44 as a mask. However, in order to ensure the implanted ions to be prevented from entering a region under the gate electrode 44, a resist mask 69 as shown in FIG. 6A may be formed before the ion implantation.

In this example, the gate electrode 44 and the resist mask 69 may have various shapes such as a circle, a square, and an octagon as observed from above.

The other method where an electric field strength buffering region is formed using side-wall films will be described with reference to FIGS. 6C and 6D.

As shown in FIG. 6C, a gate electrode 44 is formed on an n⁻-type well layer 42 via an insulating film 43 and patterned by lithography so that portions corresponding to regions which are to be source and drain regions where the electric field strength buffering regions are intended to be formed (either the source region or the drain region is enough, though both regions are used in this case) are etched away. Using this pattern of the gate electrode 44 as a mask, phosphorus ions are implanted to form n-type regions 45 with an intermediate ion concentration. Thereafter, an insulating film such as an oxide film is formed by CVD to a thickness of 3000 Å and etched back so that the insulating film is left unetched only on the side walls of the gate electrode 44 to form side-wall insulating films 48.

As shown in FIG. 6D, the insulating films 43 is patterned by lithography so that portions corresponding to regions which are to be source and drain regions are opened. A predetermined element (e.g., arsenic) is implanted via the openings to form a source region 46 and a drain region 47. As a result, n-type electric field strength buffering regions 45" with a predetermined depth are formed around the high-concentration n⁺-type source and drain regions 46 and 47.

Figure 7A:
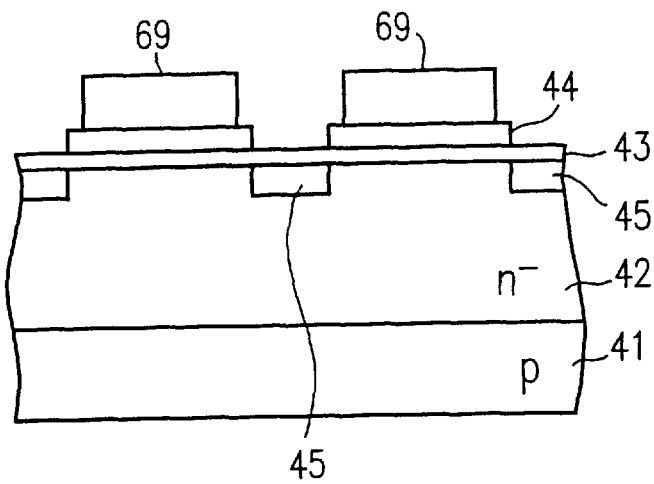
FIGS. 7A to 7C are sectional views illustrating the steps of another method for fabricating the CMD active type solid-state imaging device of Example 3 according to the present invention.
Figure 7B:
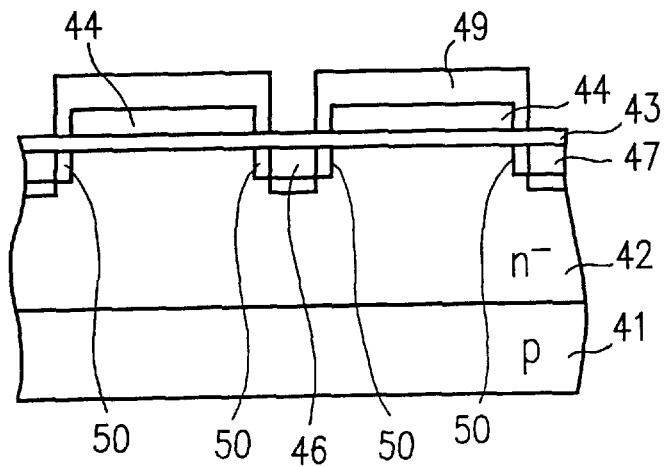
Figure 7C:
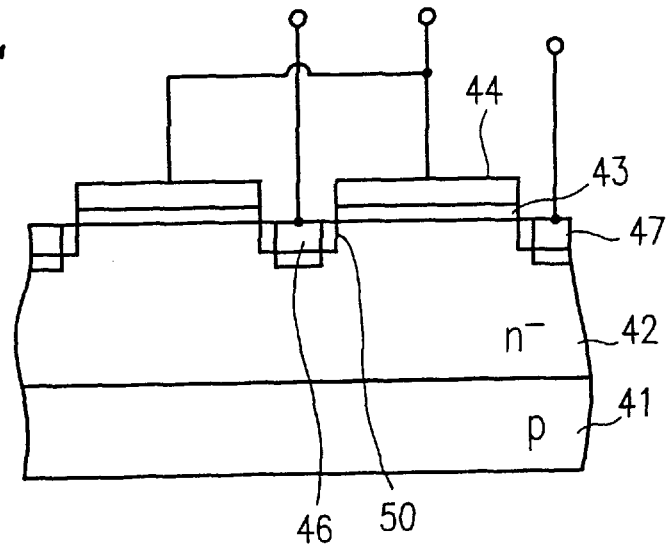

FIGS. 7A to 7C illustrate yet another method where an electric field strength buffering region is formed using a resist.

As shown in FIG. 7A, after an n⁻-type well layer 42 as the n⁻-type region is formed on a p-type semiconductor substrate 41, a gate electrode 44 is formed on the n⁻-type well layer 42 via an insulating film 43 by patterning. Using the pattern of the gate electrode 44 as a mask, a predetermined element (e.g., phosphorus) is implanted as impurity ions to form n-type regions 45 with an intermediate ion concentration.

As shown in FIG. 7B, a resist 49 is formed on the resultant structure and patterned by lithography so that a source region 46 or a drain region 47 is formed in the middle of each intermediate-concentration n-type region 45 which is to be an electric field strength buffering region 50. A predetermined element (e.g. arsenic) is then implanted as ion impurities via the openings of the pattern of the resist 49, to form high-concentration n⁺-type regions which are to be the source and drain regions 46 and 47. As a result, the n-type electric field strength buffering region 50 with an intermediate ion concentration between the concentration of the source and drain regions 46 and 47 and that of the n⁻-type well layer 42 is formed between the source and drain regions 46 and 47 and the n⁻-type well layer 42.

Subsequently, as shown in FIG. 7C, wirings are provided for the gate electrode 44, the source region 46, and the drain region 47 of each pixel portion, to complete the active type solid-state imaging device of this example.

Thus, by the above methods, the n-type electric field strength buffering region with an intermediate concentration is formed between the high-concentration n⁺-type region and the n⁻-type photoelectric conversion region. This lowers the strength of the electric field generated in and around the high-concentration n⁺-type source and drain regions. As a result, the generation of impact ions and thus dark current in the photoelectric conversion region can be reduced.

In Examples 1 to 3 above, the ion concentration of the source and drain regions is about $1 \times 10^{20}$ cm$^{-3}$ since they are in contact with wirings. The ion concentration of the n⁻-type photoelectric conversion region is set at $1 \times 10^{15}$ cm$^{-3}$ for the following reason. That is, holes (h⁺) of pairs of electrons (e⁻) and holes generated by incident light are accumulated in the surface portion of the device, while electrons are allowed to flow between the source region and the drain region via a potential channel modulated by the holes. An output signal is thus obtained. The above concentration has been determined to optimize the potential profile at this time to deplete the channel region by applying a low voltage to the gate. In the TGMIS imaging device according to the present invention, the ion concentration of the n⁻-type region is set at $5.0 \times 10^{15}$ cm$^{-3}$ and the thickness thereof (xj, see FIG. 5) is set at 1.0 μm under the application of a low voltage (5 V) to the gate.

Hereinbelow, the manner in which the electric field strength adversely affects the resultant imaging device will be described. In the following description, a model of the generation of impact ions which generally arises in memory devices is applied to the imaging device to presume a model for the imaging device.

When a simulation is conducted under the state of applying voltages to respective electrodes (operating state), the electric field is strengthened in the areas between the gate electrode and the source and drain regions. Portions of the n⁻-type photoelectric conversion region near the above area are depleted. Therefore, if electrons enter this strengthened electric field area for some reason (e.g., crystal defect or thermal excitation), they are accelerated by the electric field, colliding against one another. This collision generates electrons and holes. The generated electrons are also accelerated and collide against one another. This is repeated causing an avalanche phenomenon.

Figure 5:
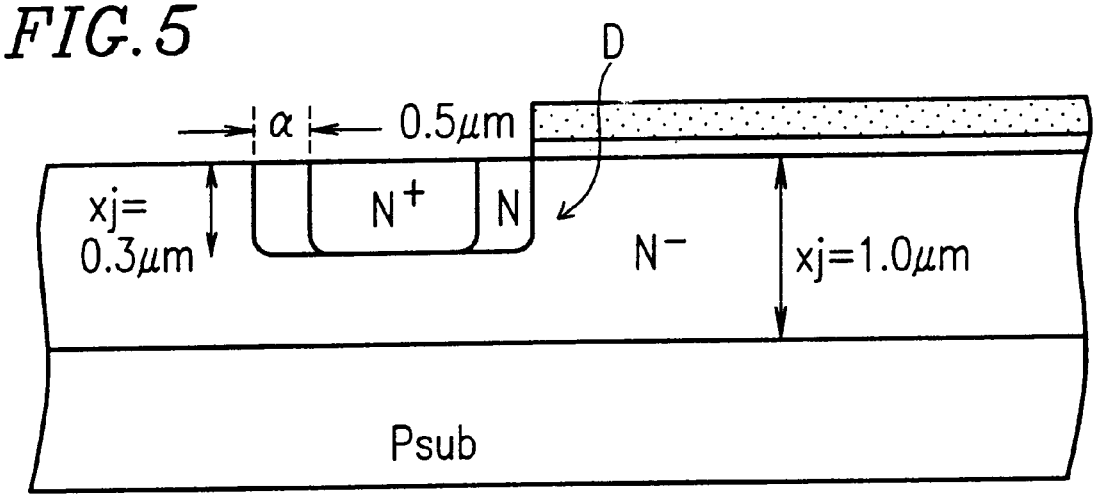
FIG. 5 is a sectional view of a pixel portion of a prototype of an active type imaging device according to the present invention.

In order to evaluate the effect of the formation of the electric field strength buffering region according to the present invention, an active type imaging device A provided with no n-type intermediate-concentration region (with n⁺-type source and drain regions only) and an active type imaging device B provided with an n-type intermediate concentration region as shown in FIG. 5 according to the present invention were fabricated by way of trial under the same fabrication conditions. The resultant devices were tested and the results as shown in Table 1 below were obtained.

TABLE 1

| Test device | A | B |
|---|---|---|
| Noise component (pseudo signal, dark output) | 93 mV/sec | 67 mV/sec |

Figure 8:
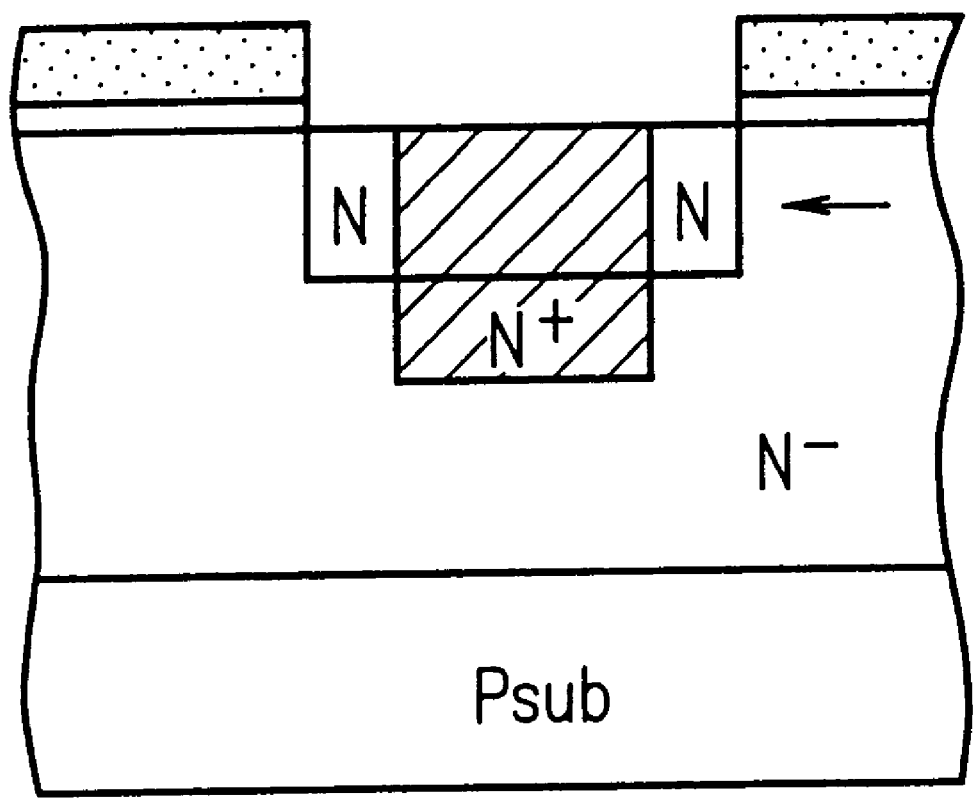
FIG. 8 is an enlarged sectional view of a pixel portion of an active type imaging device according to the present invention, illustrating source and drain regions and their vicinity in detail.

The source and drain regions and the electric field strength buffering region may also have a shape as shown in FIG. 8. That is, in the active type imaging device of the present invention, as for the potential profile in the depth direction from the surface toward the inside of the substrate, only the portion of the potential profile closer to the surface with respect to the maximum point thereof contributes to photoelectric conversion. Accordingly, the n-type electric field strength buffering region may only have a depth from the surface of the substrate to the maximum point of the potential profile. Charges generated in the other portion deeper than the maximum point are absorbed by the substrate, not contributing as signal charges. In other words, any charges which may be generated at dark time for some reason will not affect the signal charges.

In Examples 1 and 2 above, the electric field strength buffering region 26 was formed only between the drain region 24 and the n⁻-type well region 22. It may be additionally formed between the source region 23 and the n⁻-type well region 22, or it may be formed only between the source region 23 and the n⁻-type well region 22. In these cases, dark current can be reduced as in Examples 1 and 2. In Example 3, the electric field strength buffering region 45', 45" or 50 was formed both between the source region 46 and the n⁻-type well layer 42 and between the drain region 47 and the n⁻-type well layer 42. It may be formed only between the source region 46 and the n⁻-type well layer 42 or between the drain region 47 and the n⁻-type well layer 42. In these cases, also, dark current can be reduced as in Example 3.

In Examples 1 to 3 above, the cases of using a MOSFET as the transistor of the active type solid-state imaging device were shown. It will be appreciated that the present invention can also be applied to a device using a junction gate FET or a FET with a control gate. In such cases, the same functions and effects as those in Examples 1 to 3 can also be obtained.

In Examples 1 to 3 above, the TGMIS (twin gate MOS image sensor) and the CMD (charge modulation device) active type solid-state imaging devices were described. The present invention is also applicable to a BDMIS (bulk drain MOS image sensor) type. The present invention is further applicable to a modified TGMIS type where a high-concentration impurity region is formed in a reset portion and signal charges are discharged to the surface of a substrate to effect reset, and another modified TGMIS type where a trench structure for blocking the electric field is formed between a drain region of a transistor and a reset portion. Hereinbelow, examples of the present invention applied to these active type solid-state imaging devices will be described as Examples 4 to 6.

EXAMPLE 4

Figure 9:
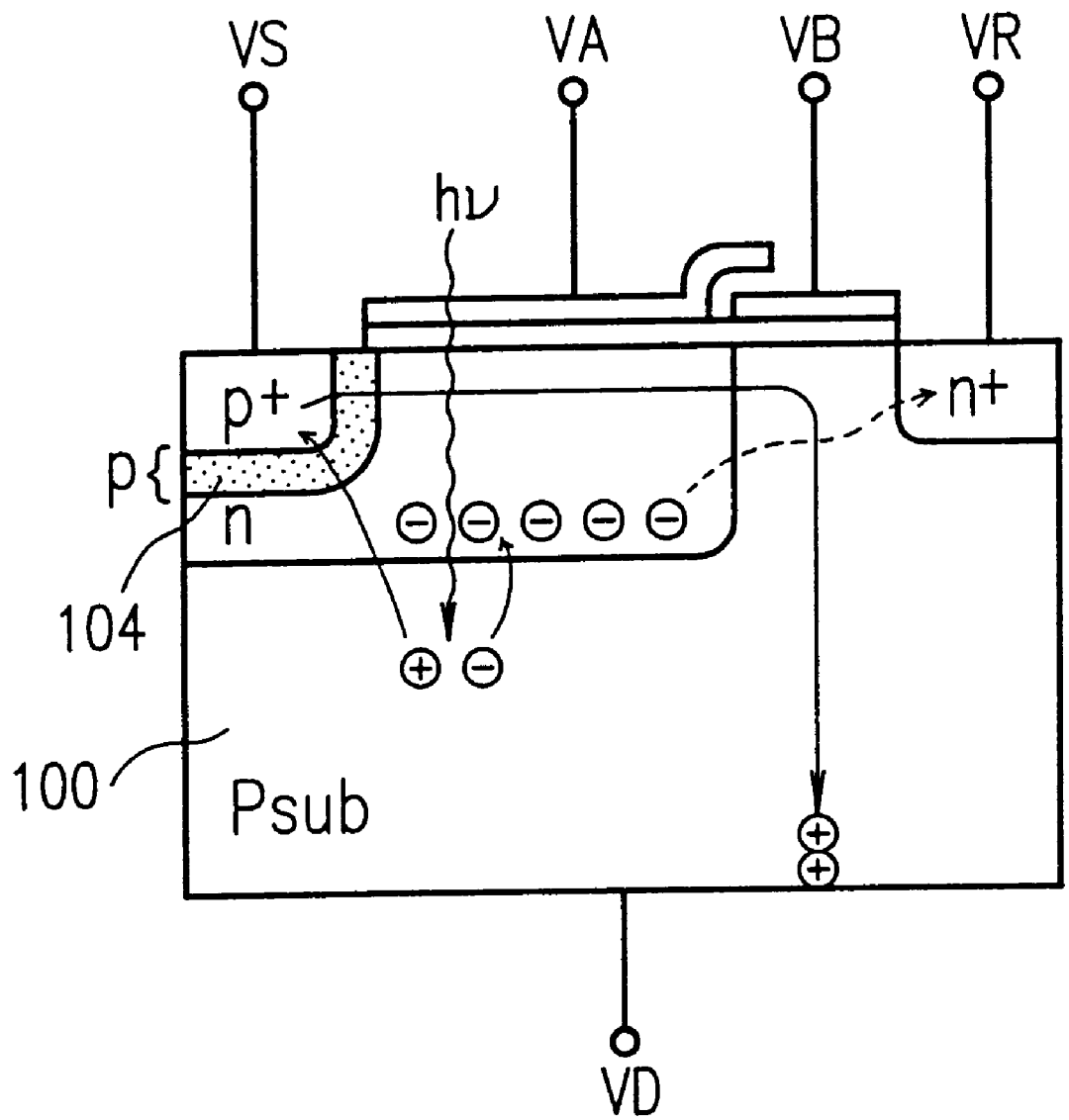
FIG. 9 is a sectional view of an active type solid-state imaging device of Example 4 according to the present invention.

FIG. 9 shows an active type solid-state imaging device of Example 4 according to the present invention. In this example, the present invention is applied to the imaging device of a BDMIS type proposed in Japanese Laid-Open Patent Publication No. 8-250697.

In the imaging device of this type, signal charges (electrons in this case) generated by incident light are accumulated under a first gate electrode (VA). The potential under the first gate electrode changes depending on the accumulation of the signal charges, thereby changing a current (holes in this case) flowing between a source (VS) and a drain (VD). This change of the current is output as a signal. The characteristics of this BDMIS imaging device are basically the same as those of the TGMIS solid-state imaging device, except that a semiconductor substrate 100 is used as the drain and that signal charges flow through the surface portion of the semiconductor substrate 100 to a reset drain (VR) via a second gate electrode (VB).

FIG. 9 shows the case where the signal charges are electrons. If holes are used as the signal charges, the conductivity of a semiconductor region 104 should be reversed.

As is shown in FIG. 9 where only a main portion of one pixel of the BDMIS active type solid-state imaging device of this example is shown, the electric field strength buffering region 104 is formed only around the source, unlike the TGMIS active type solid-state imaging devices of the present invention described above where the electric field strength buffering region is formed around the drain region. Since the source is a high-concentration p⁺-type region, the electric field strength buffering region 104 is an intermediate-concentration p-type region. The BDMIS active type imaging device of this example can be fabricated in a manner similar to those described in Examples 1 to 3 above.

EXAMPLE 5

Figure 10:
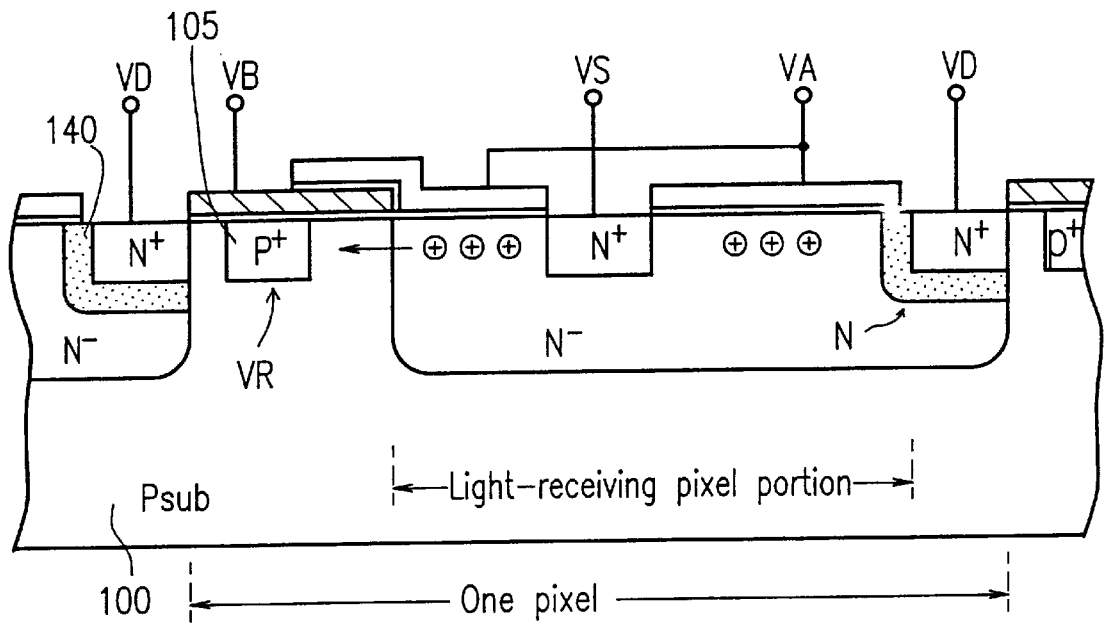
FIG. 10 is a sectional view of an active type solid-state imaging device of Example 5 according to the present invention.

FIG. 10 shows an active type solid-state imaging device of Example 5 according to the present invention. In this example, the present invention is applied to the imaging device of a surface reset type proposed in Japanese Patent Application No. 8-19199.

The imaging device of this example is different from the TGMIS active type imaging device in that a reset drain (VR) is formed in the surface portion of a substrate 100 under a second gate electrode (VB) formed adjacent to a first gate electrode (VA). Signal charges accumulated under the first gate electrode (VA) are discharged to the reset drain (VR) via the second gate electrode (VB). The other configuration is basically the same as that of the TGMIS active type imaging device.

In this example, an intermediate-concentration n-type electric field strength buffering region 140 is formed around a high-concentration n⁺-type drain region of each pixel.

EXAMPLE 6

Figure 11:
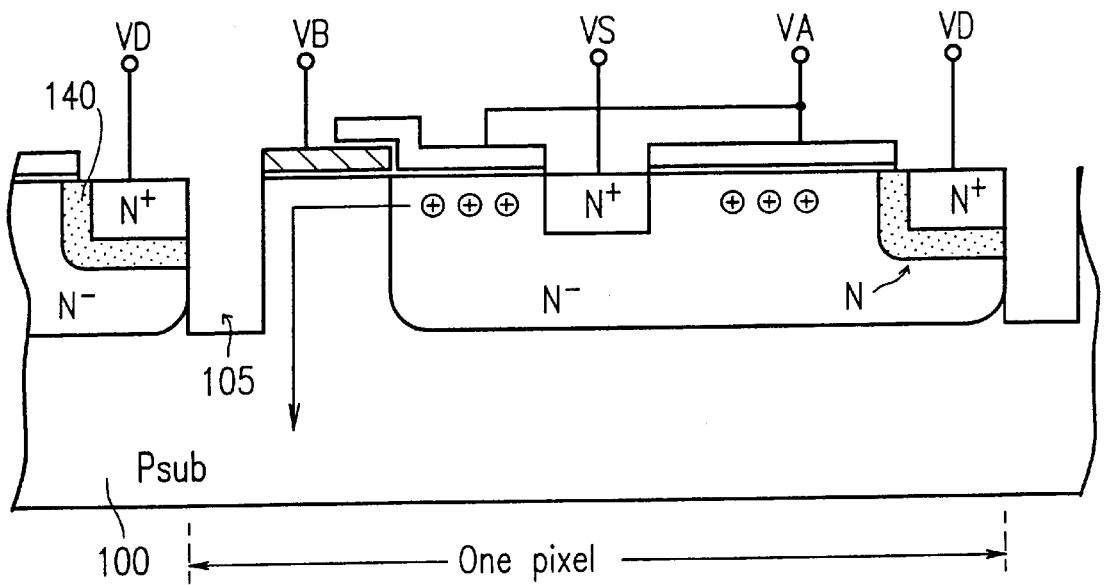
FIG. 11 is a sectional view of an active type solid-state imaging device of Example 6 according to the present invention.
Figure 12:
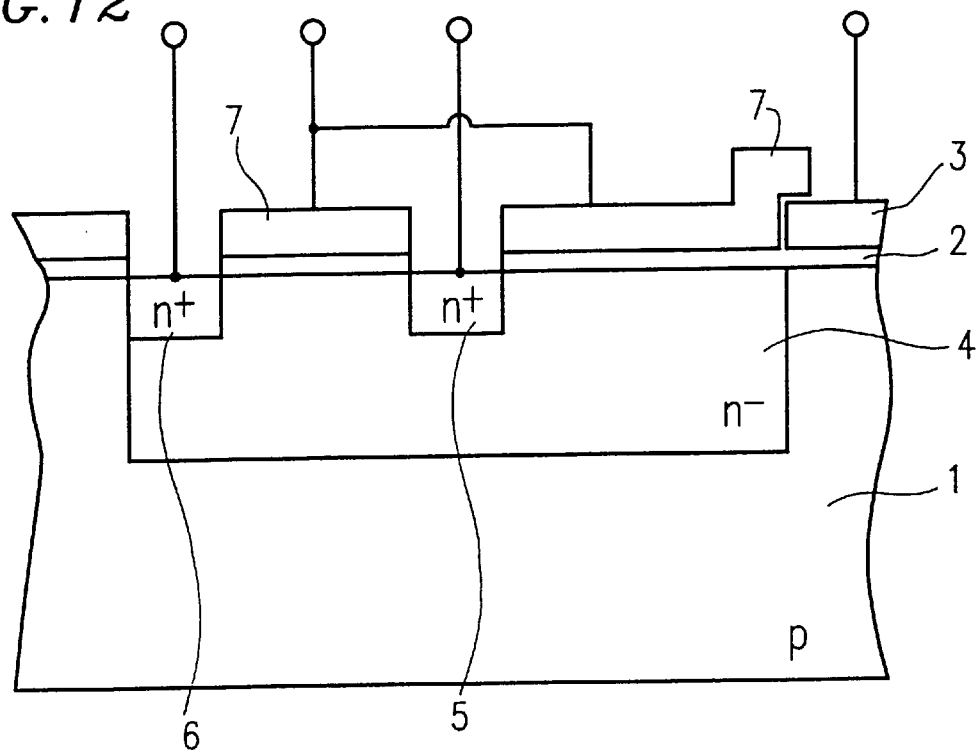
FIG. 12 is a sectional view of a pixel portion of a conventional TGMIS active type solid-state imaging device.
Figure 13:
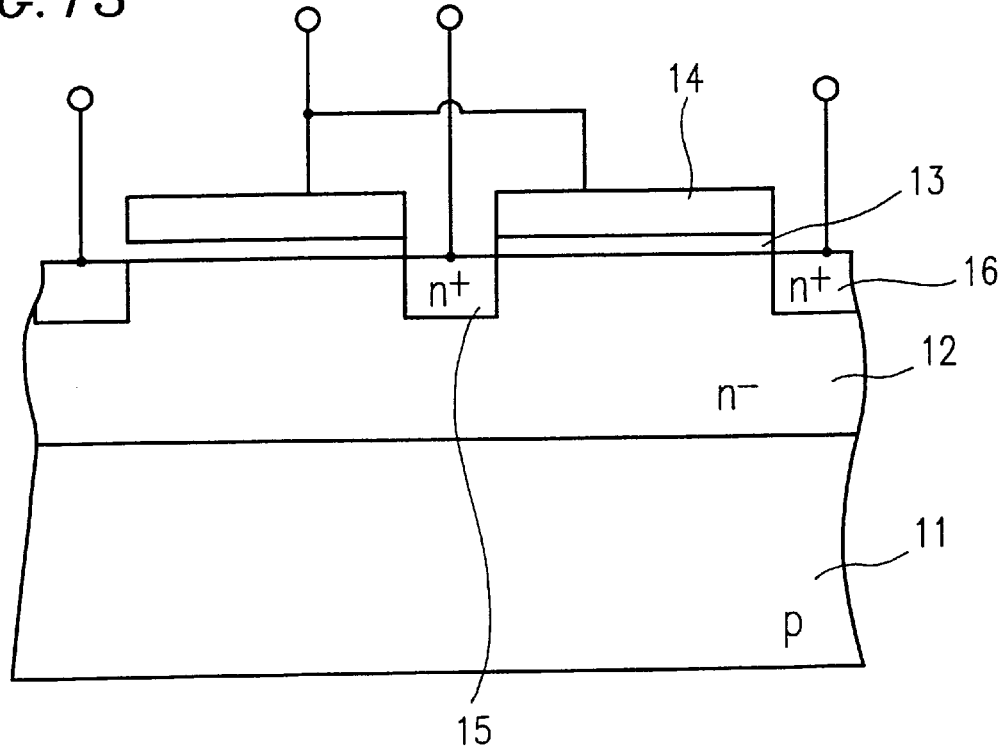
FIG. 13 is a sectional view of a pixel portion of a conventional CMD active type solid-state imaging device.

FIG. 11 shows an active type solid-state imaging device of Example 6 according to the present invention. In this example, the present invention is applied to the imaging device of a trench type proposed in Japanese Patent Application No. 8-19200.

The imaging device of this example is different from the TGMIS active type imaging device in that an electric field blocking means 105 such as a trench structure is provided in the surface portion of a substrate 100 so as to be adjacent to the side of a second gate electrode (VB) for signal reset opposite to a first gate electrode (VA) for signal charge accumulation. The other configuration is basically the same as that of the TGMIS active type imaging device.

The above configuration prevents a potential ridge which may block the signal reset operation from being formed in the middle of the substrate 100 in the depth direction, allowing substantially all accumulated signal charges to be discharged to the substrate 100.

In this example, an intermediate-concentration n-type electric field strength buffering region 140 is formed around a high-concentration n⁺-type drain region of each pixel. The electric field strength buffering region 140 can be formed in a manner similar to that described in Examples 1 to 3.

Thus, according to the present invention, an electric field strength buffering region is formed between at least one of source and drain regions of a transistor and a photoelectric conversion region in each pixel. Accordingly, the generation of impact ions in the photoelectric conversion region can be suppressed, and thus dark current or a dark output component can be reduced.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An active type solid-state imaging device having a transistor for obtaining signal charges by photoelectric conversion of incident light, accumulating the signal charges, and outputting an electric signal corresponding to the accumulated signal charges, the imaging device comprising:

an electric field strength buffering region for lowering the electric field strength between at least one of a source region and a drain region of the transistor and a photoelectric conversion region;

wherein the transistor includes a first gate region formed in a surface portion of a semiconductor base for accumulating the signal charges obtained by the photoelectric conversion;

a second gate region is formed in a surface portion of the semiconductor base adjacent to the first gate region, the signal charges being discharged to the semiconductor base via the second gate region; and wherein an electric field blocking portion is formed in the surface portion of the semiconductor base located on a side of the second gate region opposite to a side thereof adjacent to the first gate region.

2. An active type solid-state imaging device according to claim 1, wherein the electric field strength buffering region is formed in the vicinity of the drain region of the transistor.

3. An active type solid-state imaging device according to claim 1, wherein the electric field blocking portion is a trench structure.

4. An active type solid-state imaging device according to claim 1, wherein the depth of the electric field strength buffering region from the surface of the semiconductor base is equal to or more than the position of a maximum point of a potential in the photoelectric conversion region.

* * * * *